(12) United States Patent
Kobayashi

(10) Patent No.: US 8,022,620 B2
(45) Date of Patent: Sep. 20, 2011

(54) DISPLAY DEVICE FOR IMPROVING CHROMATIC PURITY

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 464 days.

(21) Appl. No.: 11/958,612

(22) Filed: Dec. 18, 2007

(65) Prior Publication Data

US 2008/0203898 A1 Aug. 28, 2008

(30) Foreign Application Priority Data

Feb. 28, 2007 (JP) ................................. 2007-048628

(51) Int. Cl.
*H05B 33/00* (2006.01)
*H05B 33/26* (2006.01)
*H01J 1/62* (2006.01)

(52) U.S. Cl. ........ 313/506; 313/504; 313/113; 428/690; 428/917

(58) Field of Classification Search .................. 313/504, 313/506

See application file for complete search history.

(56) References Cited

U.S. PATENT DOCUMENTS

| | | | | |
|---|---|---|---|---|
| 5,554,911 | A | * | 9/1996 | Nakayama et al. ............ 313/504 |
| 5,847,506 | A | * | 12/1998 | Nakayama et al. ............ 313/504 |
| 6,737,800 | B1 | * | 5/2004 | Winters et al. ................ 313/504 |
| 7,400,088 | B2 | | 7/2008 | Ryu |
| 7,667,388 | B2 | | 2/2010 | Ryu |
| 7,816,677 | B2 | * | 10/2010 | Lee et al. ......................... 257/40 |
| 2004/0056590 | A1 | * | 3/2004 | Lim et al. ...................... 313/506 |
| 2004/0217697 | A1 | * | 11/2004 | Lee et al. ...................... 313/504 |
| 2005/0140288 | A1 | * | 6/2005 | Suzuki ........................... 313/506 |
| 2005/0225232 | A1 | * | 10/2005 | Boroson et al. ............... 313/504 |
| 2006/0192471 | A1 | | 8/2006 | Inoue et al. |
| 2006/0214573 | A1 | * | 9/2006 | Maeda et al. ................. 313/506 |
| 2007/0015429 | A1 | | 1/2007 | Maeda et al. |

FOREIGN PATENT DOCUMENTS

| | | |
|---|---|---|
| CN | 1725921 A | 1/2006 |
| CN | 1848478 A | 10/2006 |
| JP | B2 2797883 | 7/1998 |
| JP | A 2004-111398 | 4/2004 |
| JP | A-2007-026852 | 2/2007 |

* cited by examiner

*Primary Examiner* — Sikha Roy
(74) *Attorney, Agent, or Firm* — Oliff & Berridge PLC

(57) ABSTRACT

A display device includes a substrate, light-emitting elements formed on the substrate, a reflective layer disposed between the substrate and the light-emitting elements and reflecting the light emitted from the light-emitting elements. The light-emitting elements each include a transparent layer that contact the reflective layer, a light-emitting layer disposed on the upper surface of the transparent layer, and an electrode layer with transparency disposed on a side of the light-emitting layer. The distance between the reflective layer and the electrode layer in each of the light-emitting elements is set such that a light component of a specific color in the light emitted from the corresponding light-emitting layer is enhanced by interference and emitted from the electrode layer. The light-emitting elements include light-emitting elements in which blue and red light components in the light emitted from the light-emitting layers are simultaneously enhanced and emitted from the electrode layers.

12 Claims, 10 Drawing Sheets

FIG. 16

| | FIRST EXAMPLE OF SECOND EMBODIMENT | | FIRST EXAMPLE OF FIRST EMBODIMENT | | SECOND EXAMPLE OF SECOND EMBODIMENT | | SECOND EXAMPLE OF FIRST EMBODIMENT | | EXAMPLE OF FOURTH EMBODIMENT | | EXAMPLE OF THIRD EMBODIMENT | |
|---|---|---|---|---|---|---|---|---|---|---|---|---|
| LIGHT-EMITTING LAYER | WHITE LIGHT WITH 2 PEAKS (COMMON TO MULTIPLE LIGHT-EMITTING ELEMENTS) | | WHITE LIGHT WITH 2 PEAKS (COMMON TO MULTIPLE LIGHT-EMITTING ELEMENTS) | | WHITE LIGHT WITH 3 PEAKS (COMMON TO MULTIPLE LIGHT-EMITTING ELEMENTS) | | WHITE LIGHT WITH 3 PEAKS (COMMON TO MULTIPLE LIGHT-EMITTING ELEMENTS) | | RGB INDEPENDENT | | | |
| STRUCTURE OF PIXEL ELECTRODE LAYER | COMMON TO RB | | COMMON TO RGB | | COMMON TO RB | | COMMON TO RGB | | COMMON TO RB | | COMMON TO RGB | |
| COUNTER ELECTRODE LAYER | TRANSPARENT (WITHOUT HALF MIRROR) | WITH HALF MIRROR | TRANSPARENT (WITHOUT HALF MIRROR) | WITH HALF MIRROR | TRANSPARENT (WITHOUT HALF MIRROR) | WITH HALF MIRROR | TRANSPARENT (WITHOUT HALF MIRROR) | WITH HALF MIRROR | TRANSPARENT (WITHOUT HALF MIRROR) | WITH HALF MIRROR | TRANSPARENT (WITHOUT HALF MIRROR) | WITH HALF MIRROR |
| NTSC RATIO (%) | 80 | 80 | 68 | 89 | 75 | 80 | 85 | 102 | 69 | 77 | 70.5 | 95 |
| RED LIGHT EXTRACTION EFFICIENCY | 0.134 | 0.123 | 0.152 | 0.146 | 0.083 | 0.1 | 0.152 | 0.121 | 0.353 | 0.267 | 0.452 | 0.605 |
| GREEN LIGHT EXTRACTION EFFICIENCY | 0.157 | 0.155 | 0.292 | 0.37 | 0.361 | 0.389 | 0.516 | 0.69 | 0.727 | 0.785 | 1.096 | 0.924 |
| BLUE LIGHT EXTRACTION EFFICIENCY | 0.075 | 0.074 | 0.046 | 0.043 | 0.103 | 0.122 | 0.052 | 0.049 | 0.61 | 0.634 | 0.32 | 0.199 |
| PERIOD OF 20% ATTENUATION (HRS) | 1040 | 1000 | 2000 | 2300 | 1300 | 1600 | 2500 | 2000 | 2100 | 2010 | 3654 | 3386 |

DISPLAY DEVICE FOR IMPROVING CHROMATIC PURITY

BACKGROUND

1. Technical Field

The present invention relates to display devices and electronic apparatuses including the display devices.

2. Related Art

To date, devices and methods of extracting light components of a plurality of colors from a single light-emitting layer using optical resonance have been proposed (for example, see Japanese Patent No. 2,797,883). Japanese Patent No. 2,797,883 describes a color display device with a simple structure. However, the thicknesses of transparent electrodes need to be changed in accordance with the emission colors of the pixels, and additional production processes such as etching are required. This leads to an increase in cost.

JP-A-2004-111398 describes a technology using a resonant structure and adjusting of resonant optical path lengths to the least common multiples of the central wavelengths of colors of light-emitting elements. This technology is intended to achieve improvements in chromatic purity and extraction efficiency of light components, which are effects of the resonant structure. Since layers that constitute the resonant structure can be used in common with the light-emitting elements of any color in this technology, the production process can be simplified.

However, the structure described in JP-A-2004-111398 is predicated on the bottom emission type. In the bottom emission structure, the brightness of the emitted light tends to be reduced since the light is emitted through the substrate. Moreover, a large aperture ratio cannot be ensured as compared with the top emission structure since thin-film transistors or wiring lines for driving the light-emitting elements are disposed between the substrate and the light-emitting elements.

Moreover, a translucent half-reflecting film formed of a thin metallic film is disposed between the light-emitting layer and the substrate such that the chromatic purity of light is enhanced by the reciprocation of the light between a cathode layer and the translucent half-reflecting film in this structure. However, it is difficult to produce the translucent half-reflecting film having desired transparency and reflectivity in a uniform manner, and the characteristics of actual products can be unstable when the improvement in the chromatic purity depends only on the translucent half-reflecting film.

SUMMARY

An advantage of some aspects of the invention is that a display device of the top emission type including light-emitting elements and an electronic apparatus including the display device are provided such that the production thereof can be facilitated while the chromatic purity is improved.

A display device according to an aspect of the invention includes a substrate, a plurality of light-emitting elements formed on the substrate, and a reflective layer disposed between the substrate and the light-emitting elements and reflecting the light emitted from the light-emitting elements. The light-emitting elements each include a transparent layer that is in contact with the reflective layer, a light-emitting layer disposed on the upper surface of the transparent layer, and an electrode layer with transparency disposed on a side of the light-emitting layer opposite the side on which the reflective layer lies. The distance between the reflective layer and the electrode layer in each of the light-emitting elements is set such that a light component of a specific color in the light emitted from the corresponding light-emitting layer is enhanced by interference and emitted from the electrode layer. The light-emitting elements include at least first light-emitting elements and second light-emitting elements in which blue and red light components in the light emitted from the light-emitting layers are simultaneously enhanced and emitted from the electrode layers.

In the description above, the term "electrode layers with transparency" means transparent electrode layers that allow passage of incident light or translucent half-reflecting electrode layers that allow passage of at least part of the incident light and reflect at least part of the incident light. For example, this includes both transparent electrode layers with a transmittance of 60% or more and translucent half-reflecting electrode layers with a transmittance of less than 60%. Since the display device according to the aspects of the invention is of the top emission type, a large aperture ratio can be easily ensured. In each of the light-emitting elements, a light component of a specific color in the light emitted from the corresponding light-emitting layer is enhanced by interference and emitted from the electrode layer. Among the light components emitted from the light-emitting layers, light components having wavelengths corresponding to red and blue are enhanced at the same time in the first and second light-emitting elements, and the purities of red and blue are improved. Therefore, common transparent layers can be used in the first and second light-emitting elements, and the production of the transparent layers in these light-emitting elements can be facilitated.

Color filters that allow passage of only blue light are preferably disposed at a light-emitting side of the electrode layers in the first light-emitting elements, and color filters that allow passage of only red light are preferably disposed at a light-emitting side of the electrode layers in the second light-emitting elements. As described above, the light components having wavelengths corresponding to red and blue are enhanced at the same time in the first and second light-emitting elements. The color filters that allow passage of blue light or red light can further improve the chromatic purity.

Moreover, it is preferable that the light-emitting elements further include third light-emitting elements in which a green light component in the light emitted from the light-emitting layers is enhanced and emitted from the electrode layers, and that the distance between the reflective layer and the electrode layer in each of the third light-emitting elements be set such that the green light component is enhanced. In this case, the light component having a wavelength corresponding to green in the light emitted from the light-emitting layers is enhanced in the third light-emitting elements, and the purity of green is improved.

The thickness of the transparent layers in the third light-emitting elements is preferably the same as those of the transparent layers in the first and second light-emitting elements. When the thicknesses of the transparent layers in the first, second, and third light-emitting elements are the same, the production of the transparent layers can be facilitated.

Color filters that allow passage of only green light are preferably disposed at a light-emitting side of the electrode layers in the third light-emitting elements. The chromatic purity of the green light passing through these color filters can be improved.

It is preferable that the transparent layers each include a transparent electrode and an insulating transparent sublayer, and that the resonant optical path lengths be adjusted by changing the thicknesses of the transparent electrodes. That is, the resonant optical path lengths of the first and second light-emitting elements can be varied from that of the third light-emitting elements by setting the thicknesses of the insulating transparent sublayers in the first, second, and third light-emitting elements to the same value and by setting the thicknesses of the transparent electrodes in the first and second light-emitting elements so as to differ from that in the third light-emitting elements. In this case, the thicknesses of the insulating transparent sublayers in the light-emitting elements can be the same. Thus, the production of the insulating transparent sublayers can be facilitated.

It is preferable that the transparent layers each include a transparent electrode and an insulating transparent sublayer, and that the resonant optical path lengths be adjusted by changing the thicknesses of the insulating transparent sublayers. That is, the resonant optical path lengths of the first and second light-emitting elements can be varied from that of the third light-emitting elements by setting the thicknesses of the transparent electrodes in the first, second, and third light-emitting elements to the same value and by setting the thicknesses of the insulating transparent sublayers in the first and second light-emitting elements so as to differ from that in the third light-emitting elements. In this case, the thicknesses of the transparent electrodes in the light-emitting elements can be the same. Thus, the production of the transparent electrodes can be facilitated.

The thicknesses of the transparent electrodes in the first and second light-emitting elements are preferably the same. In this case, the transparent electrodes in the first and second light-emitting elements can be formed in the same production process.

The insulating transparent sublayers in the transparent layers in the first, second, and third light-emitting elements are preferably common to the first, second, and third light-emitting elements. In this case, the thicknesses of the insulating transparent layers are the same in any of the light-emitting elements, and the production of these layers can be facilitated.

An organic layer disposed between the reflective layer and the electrode layers can be shared by the first, second, and third light-emitting elements. According to the aspects of the invention, light components of specific colors are enhanced by interference in the first, second, and third light-emitting elements. Therefore, the display device of the invention can be used as a display device including blue, red, and green pixels when a common light-emitting organic layer is used.

An organic layer disposed between the reflective layer and the electrode layers can include a blue-light emitting material in the first light-emitting elements, a red-light emitting material in the second light-emitting elements, and a green-light emitting material in the third light-emitting elements. According to the invention, light components of specific colors are enhanced by interference in the first, second, and third light-emitting elements. Therefore, the chromatic purity of blue, red, or green can be improved in each of the light-emitting elements.

An electronic apparatus according to another aspect of the invention includes the display device according to any one of the above-described cases as, for example, an image display device.

BRIEF DESCRIPTION OF THE DRAWINGS

The invention will be described with reference to the accompanying drawings, wherein like numbers reference like elements.

FIG. 16 shows the summary of the measurement results in the examples of the embodiments.

DESCRIPTION OF EXEMPLARY EMBODIMENTS

Figure 1:
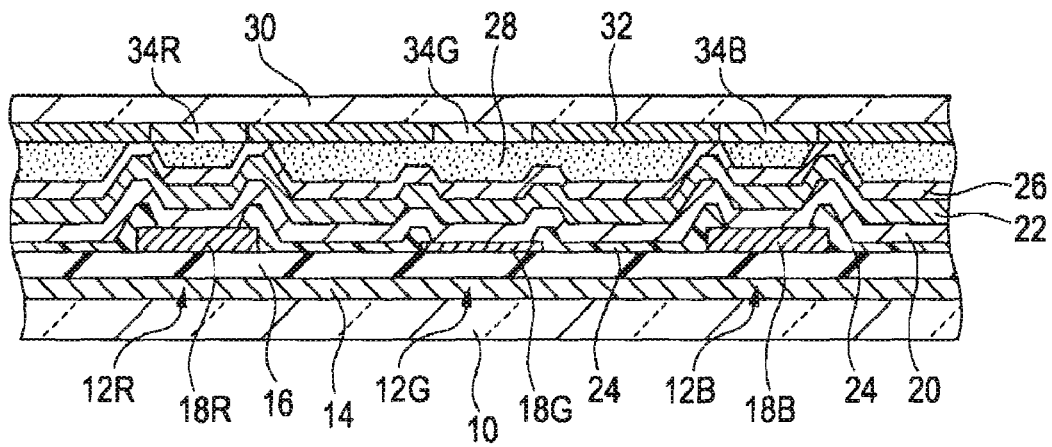
FIG. 1 is a cross-sectional view of a full-color display device of the top emission type according to a first embodiment of the invention.

Various embodiments of the invention will now be described with reference to the drawings. In the drawings, magnification scales of components are varied as appropriate from actual scales.

First Embodiment

FIG. 1 is a cross-sectional view of a full-color display device of the top emission type according to a first embodiment of the invention. The display device includes a substrate 10 serving as a flat plate composed of, for example, glass or resin, and a matrix of a large number of light-emitting elements 12 (12R, 12G, and 12B) disposed on the substrate 10 (only each one of the light-emitting elements 12R, 12G, and 12B is shown in FIG. 1). Characters R, G, and B added to the reference number indicate red, green, and blue, respectively, and correspond to color components of light emitted at a light-emitting layer and emphasized before being emitted from the light-emitting elements. The light-emitting elements 12 can be organic electroluminescent (EL) elements, i.e., organic light-emitting diodes (OLEDs).

A reflective layer 14 that reflects light emitted from the light-emitting elements 12 is disposed between the substrate 10 and the light-emitting elements 12. The reflective layer 14 is composed of a metal with high reflectivity such as aluminum, nickel, gold, and platinum. Although not shown, thin-film transistors or wiring lines for driving the light-emitting elements are disposed on the substrate 10.

An insulating transparent layer (transparent layer) 16 is disposed on the reflective layer 14. The insulating transparent layer 16 is composed of a transparent material such as silicon nitride, silicon oxide, silicon oxynitride, zinc dioxide, and aluminum oxide. Since these are inorganic materials with low gas permeability, the insulating transparent layer 16 functions as a protective layer (passivation layer) that protects the thin-film transistors, the wiring lines, and the reflective layer 14 from degradation such as oxidation.

Each of the light-emitting elements 12 includes a transparent pixel electrode layer (transparent electrode serving as a part of the transparent layer) 18 serving as a first electrode layer, a luminous layer 20, and a counter electrode layer (electrode layer) 22 with transparency serving as a second electrode layer. In FIG. 1, characters R, G, and B are added to the reference number 18 indicating the pixel electrode layers in accordance with the light-emitting elements 12R, 12G, and 12B corresponding to the pixel electrode layers. In this embodiment, the pixel electrode layers 18 are anodes, and are composed of a transparent material such as indium tin oxide (ITO), indium zinc oxide, and indium germanium oxide. These transparent materials can be formed on the insulating transparent layer 16 by film-forming methods such as ion plating.

The luminous layer 20 is composed of organic materials, and includes, for example, a hole-injecting sublayer, a hole-transporting sublayer, a light-emitting sublayer, an electron-transporting sublayer, and an electron-injecting sublayer (not shown). The luminous layer 20 does not need to include all these sublayers, but requires at least the light-emitting sublayer. In addition, the luminous layer 20 can include a hole-blocking sublayer or an electron-blocking sublayer for preventing holes or electrons from leaking from the light-emitting sublayer. The sublayers constituting the luminous layer 20 can be formed by film-forming methods such as vapor deposition.

In this embodiment, the counter electrode layer 22 is a cathode, and includes two sublayers (not shown). A first sublayer is an extremely thin layer composed of a material with low work function, for example, calcium, and a second sublayer is composed of a transparent material such as ITO. These sublayers function as an auxiliary cathode. However, the second sublayer is not required when auxiliary cathodes composed of a metal with high conductivity such as aluminum are formed around the pixels. The first sublayer is in contact with the luminous layer 20, and the second sublayer is disposed at a side of the first sublayer opposite that on which the luminous layer 20 lies. Both the first and second sublayers can be formed by deposition methods such as vapor deposition. In the case where the first sublayer is formed using calcium, the second sublayer is formed subsequent to the formation of a thin calcium film (first sublayer). With this, the calcium is oxidized by the oxygen included in the second sublayer, and the counter electrode layer 22 can function as a transparent cathode having a transmittance of 90% or more and excellent electron-injection efficiency. The second sublayer can be composed of a metal with high reflectivity such as silver and an alloy of magnesium and silver as long as the metal has a translucency.

The light-emitting elements 12 are sectioned by banks composed of an insulating material, i.e., partitions 24. The partitions 24 are composed of, for example, an inorganic material such as silicon dioxide or an organic polymer material such as polyacrylic resin and polyimide resin. The partitions 24 are formed on the insulating transparent layer 16 so as to cover the outer edges of the pixel electrode layers 18 in the light-emitting elements 12.

In this embodiment, the pixel electrode layers 18 are individually formed in the light-emitting elements 12, and the luminous layer 20 is shared by the individual light-emitting elements 12. The luminous layer 20 covers the partitions 24, and at the same time, is in contact with the central areas (pixel apertures) of the pixel electrode layers 18 in the light-emitting elements 12, the central areas thereof not being covered with the partitions 24. Moreover, the counter electrode layer 22 is a common electrode of the light-emitting elements 12. The counter electrode layer 22 covers the luminous layer 20.

A transparent protective layer (passivation layer) 26 is disposed so as to cover the counter electrode layer 22. The protective layer 26 is composed of, for example, a transparent inorganic material with low gas permeability such as silicon nitride and silicon oxynitride, and has a thickness of, for example, approximately 200 nm. Since these are inorganic materials with low gas permeability, the protective layer 26 protects the light-emitting sublayers of the luminous layer 20 and other layers from degradation such as oxidation.

A filter panel 30 is connected to the above-described structure using a transparent adhesive 28. The filter panel 30 includes a flat substrate composed of a transparent material such as glass and resin, a black matrix 32 formed on the substrate, and color filters 34 formed on the substrate. The color filters 34 are disposed over the light-emitting elements 12. The color filters 34 allow passage of most of light components in specific wavelength bands and absorb most of light components in other wavelength bands. In FIG. 1, characters R, G, and B are added to the reference number 34 indicating the color filters in accordance with the transmissive wavelength bands of the color filters. For example, color filters 34R allow passage of most of light components in the wavelength band of red (around 620 nm), and absorb most of light components in other wavelength bands. The color filters 34 disposed over the light-emitting elements in this manner can improve contrast and chromatic purity.

The light-emitting sublayer of the luminous layer 20 shared by the light-emitting elements 12 emits white light. Part of the light emitted from the light-emitting sublayer passes through the counter electrode layer 22 and the protective layer 26. On the other hand, the other part of the light emitted from the light-emitting sublayer passes through the insulating transparent layer 16 and is reflected by the reflective layer 14. In this embodiment, the distance between the reflective layer 14 and the counter electrode layer 22 in each of the light-emitting elements is set such that a light component of a specific color in the white light emitted from the light-emitting sublayer is enhanced by interference and emitted from the counter electrode layer 22. That is, a light component having a wavelength corresponding to blue in the light emitted from the light-emitting sublayer is enhanced at the light-emitting elements 12B such that the purity of blue is improved. A light component having a wavelength corresponding to green in the light emitted from the light-emitting sublayer is enhanced at the light-emitting elements 12G and light components having other wavelengths are reduced such that the purity of green is improved. Moreover, a light component having a wavelength corresponding to red in the light emitted from the light-emitting sublayer is enhanced at the light-emitting elements 12R such that the purity of red is improved.

The light including light components enhanced at specific wavelengths as described above passes through the color filters 34 disposed over the light-emitting elements 12. With this, the chromatic purity of the light emitted from the color filters 34 is further improved.

As shown in FIG. 1, the material and the thickness of the insulating transparent layer 16 are the same at each of the light-emitting elements 12R, 12G, and 12B. The pixel electrode layers 18R, 18G, and 18B are composed of the same materials and the pixel electrode layers 18R and 18B have the same thickness. However, the thickness of the pixel electrode layers 18G differs from those of the pixel electrode layers 18R and 18B. Values of the thicknesses and the materials will be described in detail in the examples described below.

Since the material and the thickness of the insulating transparent layer 16 are the same at each of the light-emitting elements 12R, 12G, and 12B, and the pixel electrode layers 18R and 18B are composed of the same material and have the same thickness, the optical path length between the reflective layer 14 and the counter electrode layer 22 at the light-emitting elements 12R is substantially the same as that at the light-emitting elements 12B (the optical path length of blue light and that of red light slightly differ from each other since the refractive indices depend on the wavelengths). The white light emitted from the light-emitting sublayer of the luminous layer 20 at the light-emitting elements 12R and 12B is enhanced by interference with both red and blue light components reflected from the reflective layer 14, and is emitted from the counter electrode layer 22. That is, both red light and blue light are enhanced at the light-emitting elements 12R and 12B. Therefore, the light emitted from the light-emitting elements 12R and that emitted from the light-emitting elements 112B have the same spectrum. When the light passes through the color filters 34R or 34B, the chromatic purity of red light or blue light, respectively can be improved.

In this embodiment, the pixel electrode layers 18R and 18B adjacent to the reflective layer 14 at the light-emitting elements 12R and 123B, respectively, are common components, and the insulating transparent layer 16 between the reflective layer 14 and the light-emitting elements is also the same component at the light-emitting elements 12R and 12B. Therefore, these layers in the light-emitting elements can be easily produced. Moreover, the insulating transparent layer 16 can be easily produced since the material and the thickness of the insulating transparent layer 16 are the same at the light-emitting elements 12R, 12G, and 12B.

Modification of First Embodiment

Figure 2:
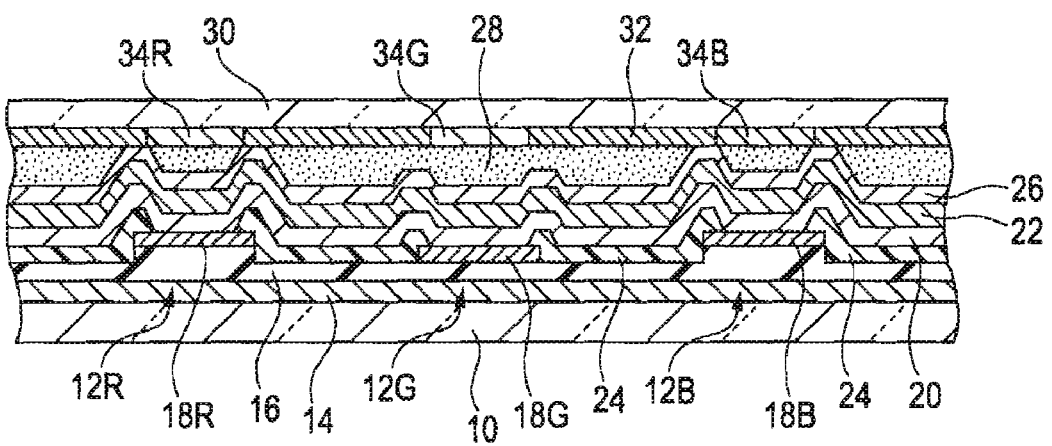
FIG. 2 is a cross-sectional view of a full-color display device of the top emission type according to a modification of the first embodiment.

FIG. 2 is a cross-sectional view of a full-color display device of the top emission type according to a modification of the first embodiment of the invention. In FIG. 2, the same reference numbers are used or components common to those in the first embodiment, and the descriptions thereof are omitted.

In this modification, the pixel electrode layers 18R, 18G, and 18B in the light-emitting elements 12R, 12G, and 12B, respectively, are composed of the same material and have the same thickness. The material of the insulating transparent layer 16 is the same at each of the light-emitting elements 12R, 12G, and 12B, and the thickness of the insulating transparent layer 16 is the same at the light-emitting elements 12R and 12B. However, the thickness of the insulating transparent layer 16 at the light-emitting elements 12G differs from those of the insulating transparent layer 16 at the light-emitting elements 12R and 12B.

Since the material and the thickness of the insulating transparent layer 16 are the same at each of the light-emitting elements 12R and 12B, and the pixel electrode layers 18R, 18C, and 18B are composed of the same material and have the same thickness, the optical path length between the reflective layer 14 and the counter electrode layer 22 at the light-emitting elements 12R is substantially the same as that at the light-emitting elements 12B (the optical path length of blue light and that of red light slightly differ from each other since the refractive indices depend on the wavelengths). The white light emitted from the light-emitting sublayer of the luminous layer 20 at the light-emitting elements 12R and 12B is enhanced by interference with both red and blue light components reflected from the reflective layer 14, and is emitted from the counter electrode layer 22. That is, both red light and blue light are enhanced at the light-emitting elements 12R and 12B. Therefore, the light emitted from the light-emitting elements 12R and that emitted from the light-emitting elements 12B have the same spectrum. When the light passes through the color filters 34R or 34B, the chromatic purity of red light or blue light, respectively, can be improved.

In this modification, the pixel electrode layers 18R and 18B adjacent to the reflective layer 14 at the light-emitting elements 12R and 12B, respectively, are common components, and the insulating transparent layer 16 between the reflective layer 14 and the light-emitting elements is also the same component at the light-emitting elements 12R and 12B. Therefore, these layers in the light-emitting elements can be easily produced. Moreover, the pixel electrode layers 18R, 18G, and 18B can be easily produced since the pixel electrode layers 18R, 18G, and 18B are composed of the same material and have the same thickness.

First Example of First Embodiment

Optical characteristics of the display device having the structure according to the first embodiment shown in FIG. 1 were investigated by simulation.

The simulation was performed under the following conditions. The insulating transparent layer 16 was composed of silicon nitride and had a uniform thickness of 50 nm. The pixel electrode layers 18G in the light-emitting elements 12G were composed of ITO and had a thickness of 60 nm. The electrode layers 18R and 18B in the light-emitting elements 12R and 12B, respectively, were composed of ITO and had a thickness of 130 nm. The counter electrode layer 22 was made transparent (hereinafter, a case including a transparent counter electrode layer 22 is referred to as an example of a layer without a half mirror).

In another example, a display device was formed under the same conditions as above except that the second sublayer of the counter electrode layer 22 was composed of an alloy of magnesium and silver so as to form a translucent half-reflecting film (half mirror). In this case, the counter electrode layer 22 reflects part of the light emitted from the light-emitting sublayer of the luminous layer 20 toward the light-emitting sublayer, and allows passage of the other part of the light therethrough. In this example, the transmittance of the counter electrode layer 22 was 60% or less (hereinafter, a case including a translucent half-reflecting film in the counter electrode layer 22 is referred to as an example of a layer with a half mirror).

Figure 3:
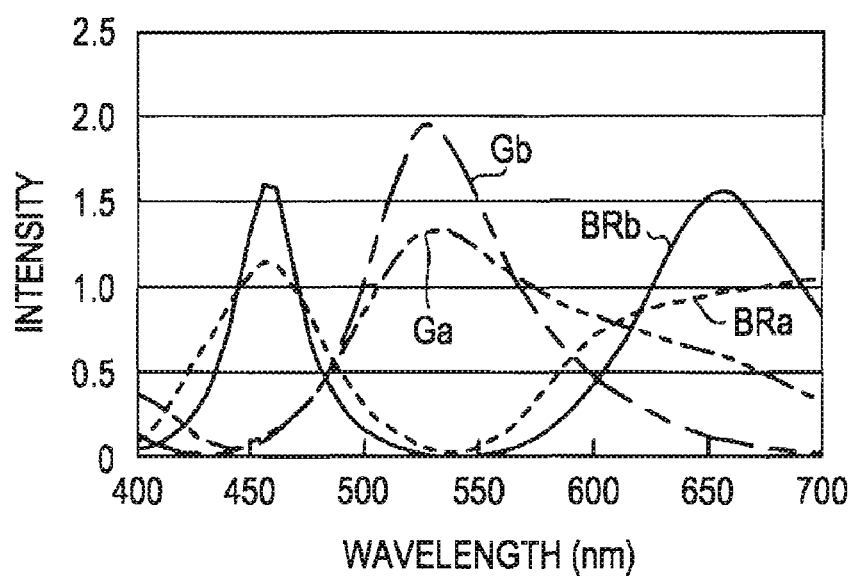
FIG. 3 illustrates results of investigation of the spectra of light in examples of the first embodiment when it is assumed that equal-energy white light is emitted from light-emitting sublayer.

FIG. 3 illustrates simulation results of the spectra of light that passed through the protective layer 26 but did not pass through the color filters 34 in the examples of the layers with and without the half mirror under the above-described conditions when it was assumed that equal-energy white light (white light whose emission intensity does not depend on wavelengths in the visible wavelength band, i.e., virtual white light whose intensity at each wavelength in the visible wavelength band is the same) was emitted from the light-emitting sublayer. In FIG. 3; a curve Ga indicates the spectrum of light obtained by the emission of the light-emitting elements 12G and the reflection from the reflective layer 14 in the example including a transparent counter electrode layer 22 (without the half mirror). A curve Gb indicates the spectrum of light obtained by the emission of the light-emitting elements 12G; the reflection from the reflective layer 14, and the reflection from the counter electrode layer 22 in the example including the counter electrode layer 22 with the half mirror. A curve BRa indicates the spectrum of light obtained by the emission of the light-emitting elements 12B or 12R and the reflection from the reflective layer 14 in the example including the transparent counter electrode layer 22. A curve BRb indicates the spectrum of light obtained by the emission of the light-emitting elements 123B or 12R, the reflection from the reflective layer 14, and the reflection from the counter electrode layer 22 in the example including the counter electrode layer 22 with the half mirror.

As is clear from FIG. 3, the chromatic purity of the green light at the light-emitting elements 12G was improved and the chromatic purities of the blue light and red light at the light-emitting elements 12B and 12R were improved regardless of the presence of the half mirror. When the half mirror was not included, the peak intensities were reduced as compared with the case when the half mirror was included. However, the light components in the desired wavelength bands were sufficiently enhanced as compared with those in the other wavelength bands. Therefore, an improvement in extraction efficiency of the light components in the desired wavelength bands can be expected, depending on the material of the actual light-emitting sublayer, even when the half mirror is not included.

Figure 4:
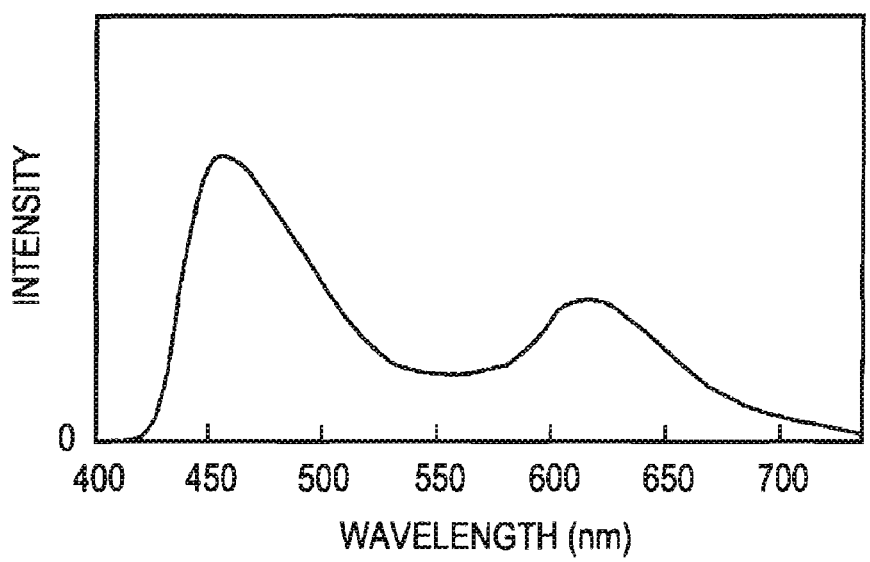
FIG. 4 illustrates the emission spectrum of an existing two-peak white-light emitting layer.

The spectra of light passing through the protective layer 26 and the spectra of light passing through the color filters 34 were investigated by simulation under the same simulation conditions as above using the light-emitting sublayer exhibiting the emission spectrum shown in FIG. 4. As shown in FIG. 4, the light-emitting sublayer is an existing white-light emitting layer having two intensity peaks at wavelengths corresponding to blue and orange.

Figure 5:
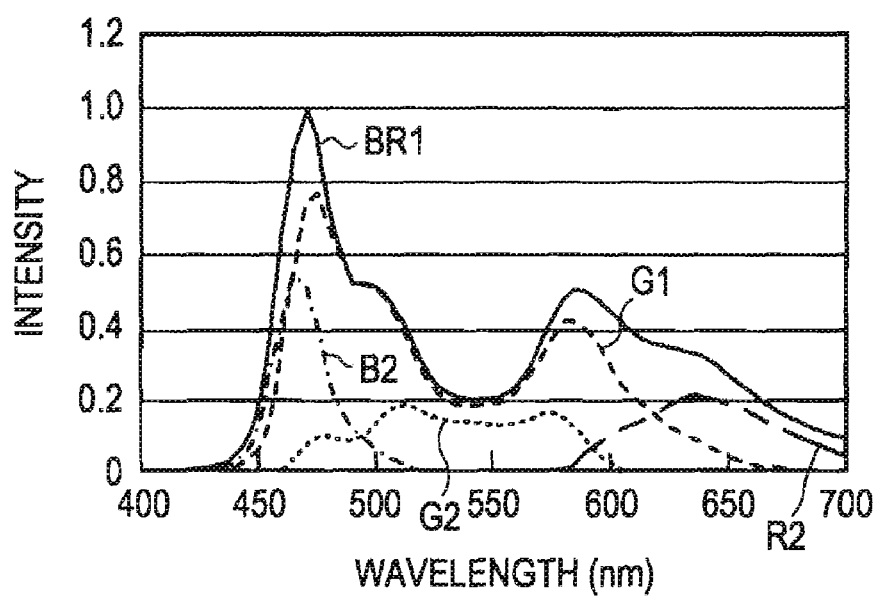
FIG. 5 illustrates results of investigation of the spectra of light using the light-emitting sublayer exhibiting the emission spectrum shown in FIG. 4 in the first embodiment.

FIG. 5 illustrates simulation results of the spectra of light passing through the protective layer 26 and the spectra of light passing through the color filters 34 using the light-emitting sublayer exhibiting the emission spectrum shown in FIG. 4 in the first embodiment. FIG. 5 shows results of the example in which the counter electrode layer 22 was transparent, and did not include a half mirror.

In FIG. 5, a curve G1 indicates the spectrum of light emitted at the light-emitting elements 12G, reflected from the reflective layer 14, and passing through the protective layer 26 without passing through the color filters 34G. A curve G2 indicates the spectrum of light emitted at the light-emitting elements 12G, reflected from the reflective layer 14, and passing through the protective layer 26 and the color filters 34G. A curve BR1 indicates the spectrum of light emitted at the light-emitting elements 12B or 12R, reflected from the reflective layer 14, and passing through the protective layer 26 without passing through the color filters 34B and 34R. A curve B2 indicates the spectrum of light emitted at the light-emitting elements 12B, reflected from the reflective layer 14, and passing through the protective layer 26 and the color filters 34B. A curve R2 indicates the spectrum of light emitted at the light-emitting elements 12R, reflected from the reflective layer 14, and passing through the protective layer 26 and the color filters 34R.

As is clear from the curves B2, G2, and R2 in FIG. 5, the light components passing through the color filters 34B, 34G, and 34R were enhanced in the blue, green, and red wavelength bands, respectively, as compared with the light components in the other wavelength bands. Therefore the display device according to this example can be used as an image display device including blue, green, and red pixels.

When the white-light emitting layer having the two peaks used in this example is employed, the thicknesses of the pixel electrode layers 18G and the insulating transparent layer 16 are preferably set such that the intensity at the wavelength of around 500 nm, at which the original intensity is high, close to 550 nm is enhanced since the intensity of the original emission spectrum of the light-emitting sublayer shown in FIG. 4 is low at the wavelength of around 550 nm. This is the reason the pixel electrode layers 18G are formed so as to have a thickness of 60 nm using ITO.

In the example of the layer without the half mirror, a ratio of the brightness of red light passing through the color filters 34R to that of the red light components of the light emitted from white-light emitting elements in a typical bottom emission structure (extraction efficiency) was 0.152, a ratio of the brightness of green light passing through the color filters 34G to that of the green light components of the light emitted from the white-light emitting elements was 0.292, and a ratio of the brightness of blue light passing through the color filters 34B to that of the blue light components of the light emitted from the white-light emitting elements was 0.046. The NTSC ratio of the light passing through the color filters in this example was 68%. The period of 20% attenuation (period until the brightness is attenuated to 80% of the initial brightness) of the light-emitting elements in this example was 2,000 hours.

On the other hand, in the example of the layer with the half mirror, the ratio of the brightness of red light passing through the color filters 34R to that of the red light components of the light emitted from the white-light emitting elements in a typical bottom emission structure (extraction efficiency) was 0.146, the ratio of the brightness of green light passing through the color filters 34G to that of the green light components of the light emitted from the white-light emitting elements was 0.37, and the ratio of the brightness of blue light passing through the color filters 34B to that of the blue light components of the light emitted from the white-light emitting elements was 0.043. The NTSC ratio of the light passing through the color filters in this example was 89%. Moreover, the period of 20% attenuation of the light-emitting elements in this example was 2,300 hours.

Second Example of First Embodiment

Figure 6:
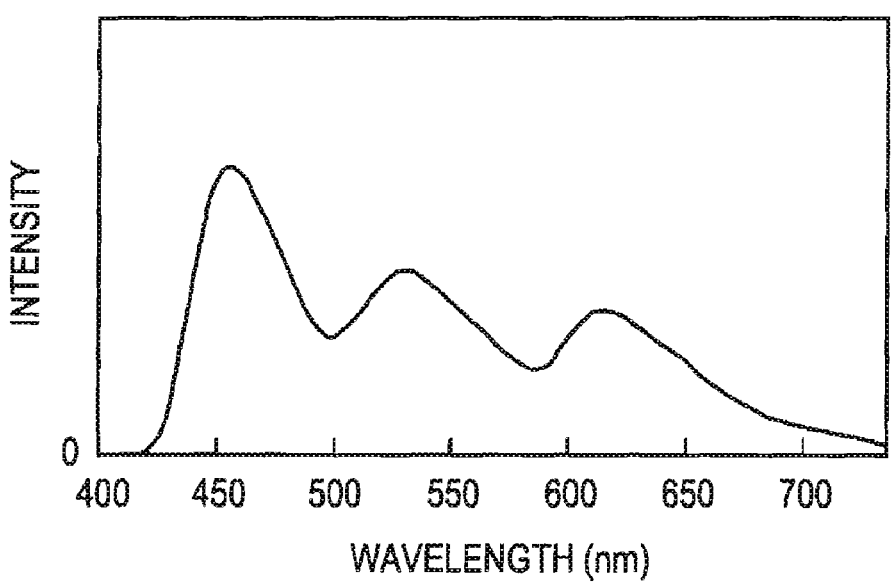
FIG. 6 illustrates the emission spectrum of an existing three-peak white-light emitting layer.

The spectra of light passing through the protective layer 26 and the spectra of light passing through the color filters 34 were investigated by simulation using the light-emitting sublayer exhibiting the emission spectrum shown in FIG. 6. As shown in FIG. 6, the light-emitting sublayer is an existing white-light emitting layer having three intensity peaks at wavelengths corresponding to blue, green, and red.

Figure 7:
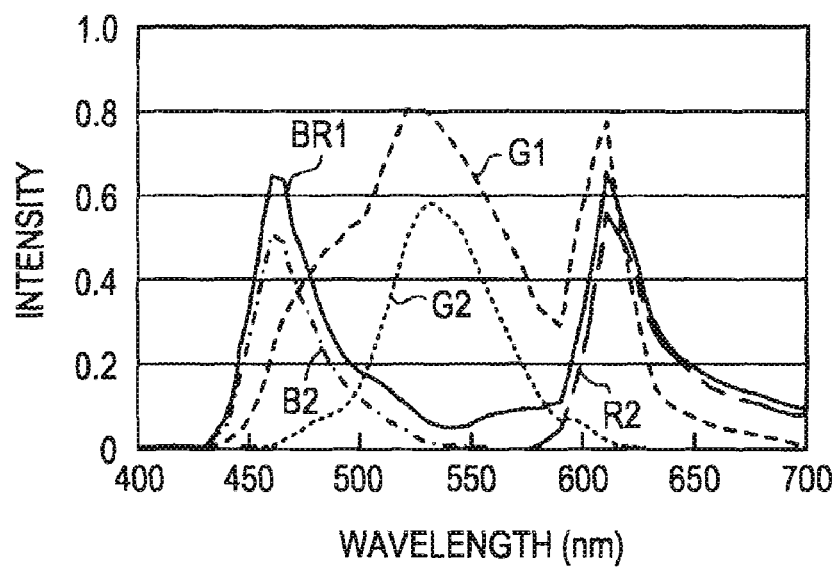
FIG. 7 illustrates results of investigation of the spectra of light using the light-emitting sublayer exhibiting the emission spectrum shown in FIG. 6 in the first embodiment.

FIG. 7 illustrates simulation results of the spectra of light passing through the protective layer 26 and the spectra of light passing through the color filters 34 using the light-emitting sublayer exhibiting the emission spectrum shown in FIG. 6 in the first embodiment. FIG. 7 shows results of the example in which the counter electrode layer 22 was transparent, and did not include the half mirror.

The simulation was performed under the following conditions. The insulating transparent layer 16 was composed of silicon nitride and had a uniform thickness of 50 nm. The pixel electrode layers 18G in the light-emitting elements 12G were composed of ITO and had a thickness of 70 nm. The electrode layers 11R and 18B in the light-emitting elements 12R and 12B, respectively, were composed of ITO and had a thickness of 130 nm. The counter electrode layer 22 was made transparent. This example is the same as the first example except for the thickness of the pixel electrode layers 18G.

In FIG. 7, the curves G1, G2, BR1, B2, and R2 indicate the same spectra as in FIG. 5. As is clear from the curves B2, G2 and R2 in FIG. 7, the light components passing through the color filters 34B, 34G, and 34R were enhanced in the blue, green, and red wavelength bands, respectively, as compared with the light components in the other wavelength bands. Therefore, the display device according to this example can be used as an image display device including blue, green, and red pixels.

In the example of the layer without the half mirror, the ratio of the brightness of red light passing through the color filters 34R to that of the red light components of the light emitted from the white-light emitting elements in a typical bottom emission structure (extraction efficiency) was 0.152, the ratio of the brightness of green light passing through the color filters 34G to that of the green light components of the light emitted from the white-light emitting elements was 0.516, and the ratio of the brightness of blue light passing through the color filters 34B to that of the blue light components of the light emitted from the white-light emitting elements was 0.052. The NTSC ratio of the light passing through the color filters in this example was 85%. Moreover, the period of 20% attenuation of the light-emitting elements in this example was 2,500 hours.

On the other hand, in the example of the layer with the half mirror, the ratio of the brightness of red light passing through the color filters 34R to that of the red light components of the light emitted from the white-light emitting elements in a typical bottom emission structure (extraction efficiency) was 0.121, the ratio of the brightness of green light passing through the color filters 34G to that of the green light components of the light emitted from the white-light emitting elements was 0.69, and the ratio of the brightness of blue light passing through the color filters 34B to that of the blue light components of the light emitted from the white-light emitting elements was 0.049. The NTSC ratio of the light passing through the color filters in this example was 102%. Moreover, the period of 20% attenuation of the light-emitting elements in this example was 2,000 hours.

Second Embodiment

Figure 8:
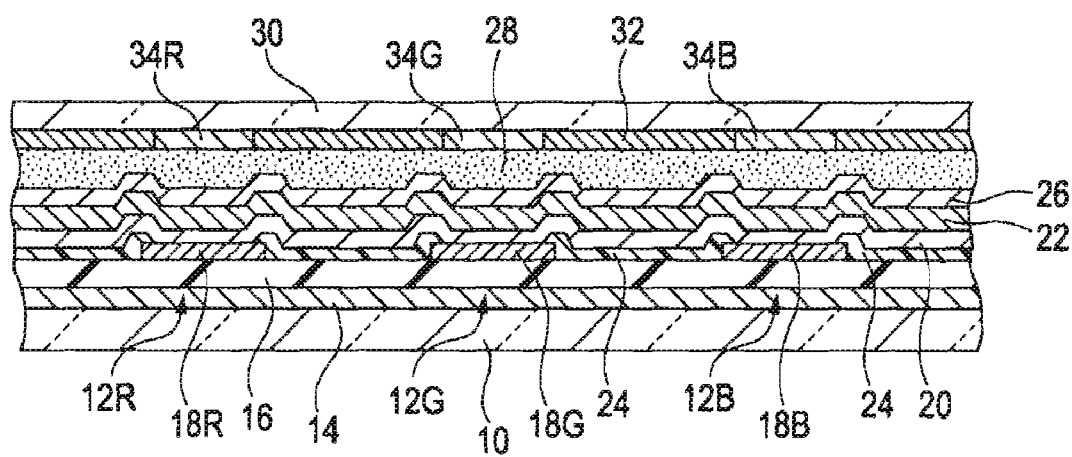
FIG. 8 is a cross-sectional view illustrating a full-color display device of the top emission type according to a second embodiment of the invention.

FIG. 8 is a cross-sectional view illustrating a full-color display device of the top emission type according to a second embodiment of the invention. In FIG. 8, the same reference numbers are used for components common to those in the first embodiment, and the descriptions thereof are omitted.

As shown in FIG. 8, the material and the thickness of the insulating transparent layer 16 are the same at each of the light-emitting elements 12R, 12G, and 12B. The pixel electrode layers 18R, 18G, and 18B are composed of the same material, and have the same thickness. Values of the thicknesses and the materials will be described in detail in the examples described below.

Since the material and the thickness of the insulating transparent layer 16 are the same at each of the light-emitting elements 12R, 12G, and 12B, and the pixel electrode layers 18R, 18G, and 18B are composed of the same material and have the same thickness, the optical path length between the reflective layer 14 and the counter electrode layer 22 at each of the light-emitting elements 12R, 12G, and 12B is substantially the same (the optical path lengths of blue light, green light, and red light slightly differ from each other since the refractive indices depend on the wavelengths). The white light emitted from the light-emitting sublayer of the luminous layer 20 at the light-emitting elements 12R, 12G, and 12B is enhanced by interference with red, green, and blue light components reflected from the reflective layer 14, and is emitted from the counter electrode layer 22. That is, all the red light, green light, and blue light are enhanced at the light-emitting elements 12R, 12G, and 12B. Therefore, the light emitted from the light-emitting elements 12R, that emitted from the light-emitting elements 12G, and that emitted from the light-emitting elements 12B have the same spectrum. When the light passes through the color filters 34R, 34G, or 34B, the chromatic purity of red light, green light, or blue light, respectively, can be improved.

In this embodiment, the pixel electrode layers 18R, 18G, and 18B adjacent to the reflective layer 14 at the light-emitting elements 12R, 12G, and 12B, respectively, are common components, and the insulating transparent layer 16 between the reflective layer 14 and the light-emitting elements is also the same component at the light-emitting elements 12R, 12G, and 12B. Therefore, these layers in the light-emitting elements can be easily produced.

First Example of Second Embodiment

Optical characteristics of the display device having the structure according to the second embodiment shown in FIG. 8 were investigated by simulation.

The simulation was performed under the following conditions. The insulating transparent layer 16 was composed of silicon nitride and had a uniform thickness of 570 nm. The pixel electrode layers 18R, 18G, and 18B were composed of ITO and had a thickness of 100 nm. The counter electrode layer 22 was made transparent (example of the layer without the half mirror).

In another example, a display device was formed under the same conditions as above except that the second sublayer of the counter electrode layer 22 was composed of an alloy of magnesium and silver so as to form a translucent half-reflecting film (half mirror). In this case, the counter electrode layer 22 reflects part of the light emitted from the light-emitting sublayer of the luminous layer 20 toward the light-emitting sublayer, and allows passage of the other part of the light therethrough. In this example, the transmittance of the counter electrode layer 22 was 60% or less (example of the layer with the half mirror).

Figure 9:
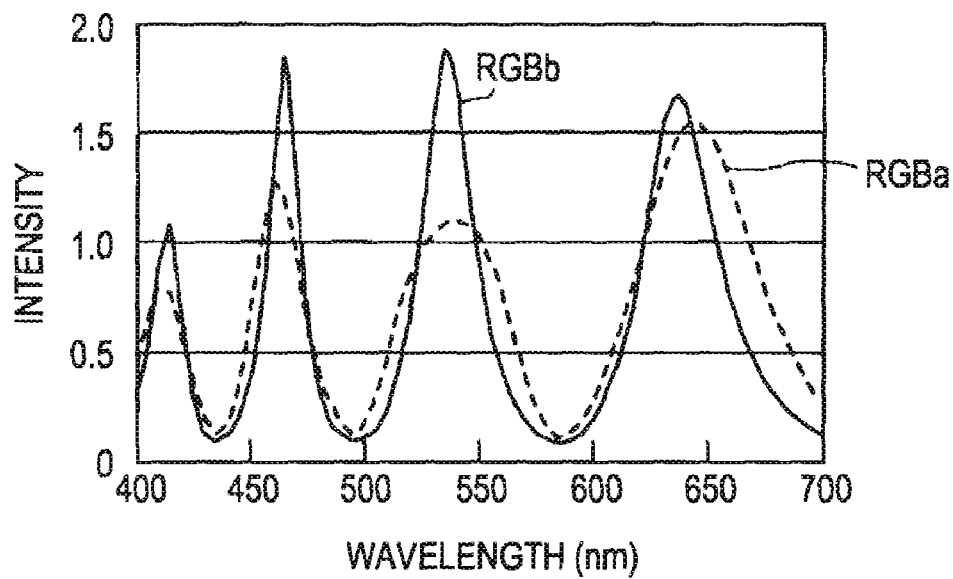
FIG. 9 illustrates results of investigation of the spectra of light in examples of the second embodiment when it is assumed that equal-energy white light is emitted from the light-emitting sublayer.

FIG. 9 illustrates simulation results of the spectra of light that passed through the protective layer 26 but did not pass through the color filters 34 in the examples of the layers with and without the half mirror under the above-described conditions when it was assumed that equal-energy white light was emitted from the light-emitting sublayer. In FIG. 9, a curve RGBa indicates the spectrum of light obtained by the emission of the light-emitting elements 12R 12G, or 12B and the reflection from the reflective layer 14 in the example including the transparent counter electrode layer 22 without the half mirror). A curve RGBb indicates the spectrum of light obtained by the emission of the light-emitting elements 12R, 12G, or 12B, the reflection from the reflective layer 14, and the reflection from the counter electrode layer 22 in the example including the counter electrode layer 22 with the half mirror.

As is clear from FIG. 3, the chromatic purities of the red light, green light, and blue light at each of the light-emitting elements were improved regardless of the presence of the half mirror. When the half mirror was not included, the peak intensities were reduced as compared with the case when the half mirror was included. However, it is anticipated that the power did not differ from that when the half mirror was included so much since the half-widths of the peaks were large. Therefore, an improvement in extraction efficiency of the light components in the desired wavelength bands can be expected, depending on the material of the actual light-emitting sublayer, even when the half mirror is not included.

The spectra of light passing through the protective layer 26 and the spectra of light passing through the color filters 34 were investigated by simulation under the same simulation conditions as above using the two-peak white-light emitting layer exhibiting the emission spectrum shown in FIG. 4.

Figure 10:
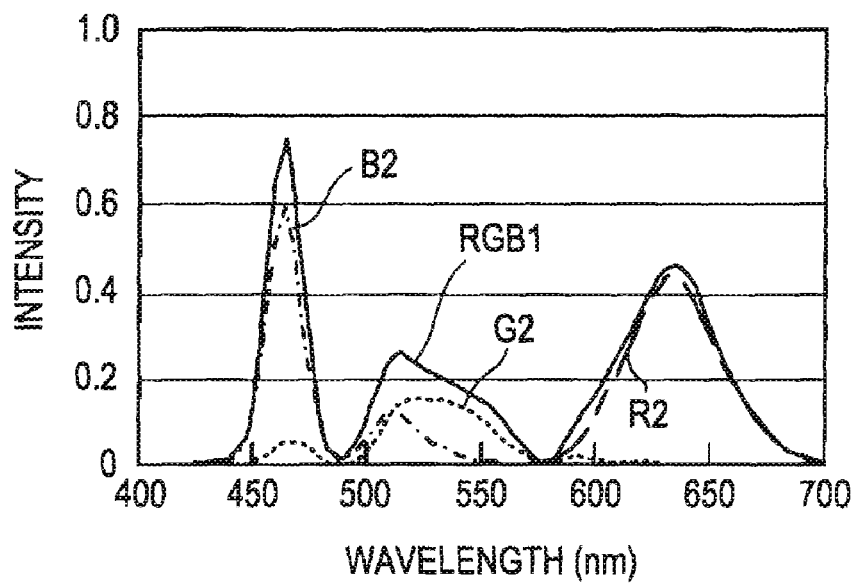
FIG. 10 illustrates results of investigation of the spectra of light using the light-emitting sublayer exhibiting the emission spectrum shown in FIG. 4 in the second embodiment.

FIG. 10 illustrates simulation results of the spectra of light passing through the protective layer 26 and the spectra of light passing through the color filters 34 using the two-peak white-light emitting layer exhibiting the emission spectrum shown in FIG. 4 in the second embodiment. FIG. 10 shows results of the example in which the counter electrode layer 22 was transparent, and did not include the half mirror.

In FIG. 10, a curve RGB1 indicates the spectrum of light emitted at the light-emitting elements 12R, 12G, or 12B, reflected from the reflective layer 14, and passing through the protective layer 26 without passing through the color filters 34. A curve R2 indicates the spectrum of light emitted at the light-emitting elements 12R, reflected from the reflective layer 14, and passing through the protective layer 26 and the color filters 34R. A curve G2 indicates the spectrum of light emitted at the light-emitting elements 12G, reflected from the reflective layer 14, and passing through the protective layer 26 and the color filters 34G. A curve B2 indicates the spectrum of light emitted at the light-emitting elements 12B, reflected from the reflective layer 14, and passing through the protective layer 26 and the color filters 34B.

As is clear from the curves B2, G2, and R2 in FIG. 10, the light components passing through the color filters 34B, 34G, and 34R were enhanced in the blue, green, and red wavelength bands, respectively, as compared with the light components in the other wavelength bands. Therefore, the display device according to this example can be used as an image display device including blue, green, and red pixels.

Since the color filters combined in this example had permeability characteristics suitable for liquid crystals, the color filters allowed passage of light components having wavelengths of emission colors other than those allocated to the pixels. However, the NTSC ratio of the light passing through the color filters still achieved 80% in this example.

In the example of the layer without the half mirror, the ratio of the brightness of red light passing through the color filters 34R to that of the red light components of the light emitted from the white-light emitting elements in a typical bottom emission structure (extraction efficiency) was 0.134, the ratio of the brightness of green light passing through the color filters 34G to that of the green light components of the light emitted from the white-light emitting elements was 0.157, and the ratio of the brightness of blue light passing through the color filters 34B to that of the blue light components of the light emitted from the white-light emitting elements was 0.075. The extraction efficiency of green light was significantly low as compared with that in the examples of the first embodiment. Moreover, the period of 20% attenuation of the light-emitting elements in this example was 1,040 hours.

On the other hand, in the example of the layer with the half mirror, the ratio of the brightness of red light passing through the color filters 34R to that of the red light components of the light emitted from the white-light emitting elements in a typical bottom emission structure (extraction efficiency) was 0.123, the ratio of the brightness of green light passing through the color filters 34G to that of the green light components of the light emitted from the white-light emitting elements was 0.155, and the ratio of the brightness of blue light passing through the color filters 34B to that of the blue light components of the light emitted from the white-light emitting elements was 0.074. The NTSC ratio of the light passing through the color filters in this example was 80%. Moreover, the period of 20% attenuation of the light-emitting elements in this example was 1,000 hours. The lifetime in the example of the layer without the half mirror was longer than that with the half mirror.

Second Example of Second Embodiment

The spectra of light passing through the protective layer 26 and the spectra of light passing through the color filters 34 were investigated by simulation using the three-peak white-light emitting layer exhibiting the emission spectrum shown in FIG. 6.

Figure 11:
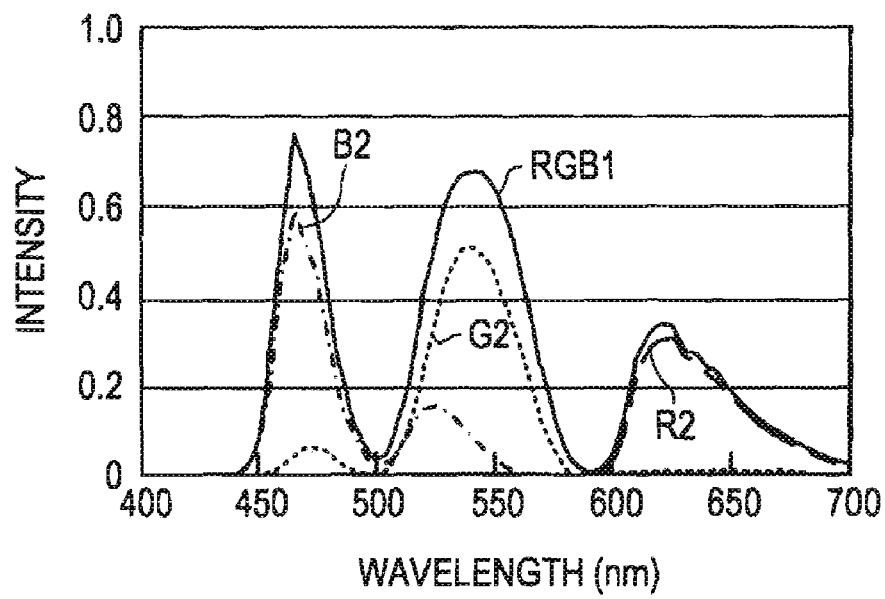
FIG. 11 illustrates results of investigation of the spectra of light using the light-emitting sublayer exhibiting the emission spectrum shown in FIG. 6 in the second embodiment.

FIG. 11 illustrates simulation results of the spectra of light passing through the protective layer 26 and the spectra of light passing through the color filters 34 using the three-peak white-light emitting layer exhibiting the emission spectrum shown in FIG. 6 in the second embodiment. FIG. 11 shows results of the example in which the counter electrode layer 22 was transparent, and did not include the half mirror. The simulation conditions were the same as those in the first example of the second embodiment.

In FIG. 11, the curves RGB1, B2, G2, and R2 indicate the same spectra as in FIG. 10. As is clear from the curves B2, G2, and R2 in FIG. 11, the light components passing through the color filters 34B, 34G, and 34R were enhanced in the blues green, and red wavelength bands, respectively, as compared with the light components in the other wavelength bands. Therefore, the display device according to this example can be used as an image display device including blue, green, and red pixels.

In the example of the layer without the half mirror, the ratio of the brightness of red light passing through the color filters 34R to that of the red light components of the light emitted from the white-light emitting elements in a typical bottom emission structure (extraction efficiency) was 0.083, the ratio of the brightness of green light passing through the color filters 34G to that of the green light components of the light emitted from the white-light emitting elements was 0.361, and the ratio of the brightness of blue light passing through the color filters 34B to that of the blue light components of the light emitted from the white-light emitting elements was 0.103. The extraction efficiencies of green light and blue light were significantly improved as compared with those in the second example of the second embodiments. The NTSC ratio of the light passing through the color filters in this example was 75%. Moreover, the period of 20% attenuation of the light-emitting elements in this example was 1,300 hours.

On the other hand, in the example of the layer with the half mirror, the ratio of the brightness of red light passing through the color filters 34R to that of the red light components of the light emitted from the white-light emitting elements in a typical bottom emission structure (extraction efficiency) was 0.1, the ratio of the brightness of green light passing through the color filters 34G to that of the green light components of the light emitted from the white-light emitting elements was 0.389, and the ratio of the brightness of blue light passing through the color filters 34B to that of the blue light components of the light emitted from the white-light emitting elements was 0.122. The NTSC ratio of the light passing through the color filters in this example was 80%. Moreover, the period of 20% attenuation of the light-emitting elements in this example was 1,600 hours.

It is conceivable that the range of color representation could be further increased in both examples by designing the color filters more appropriately.

Third Embodiment

Figure 12:
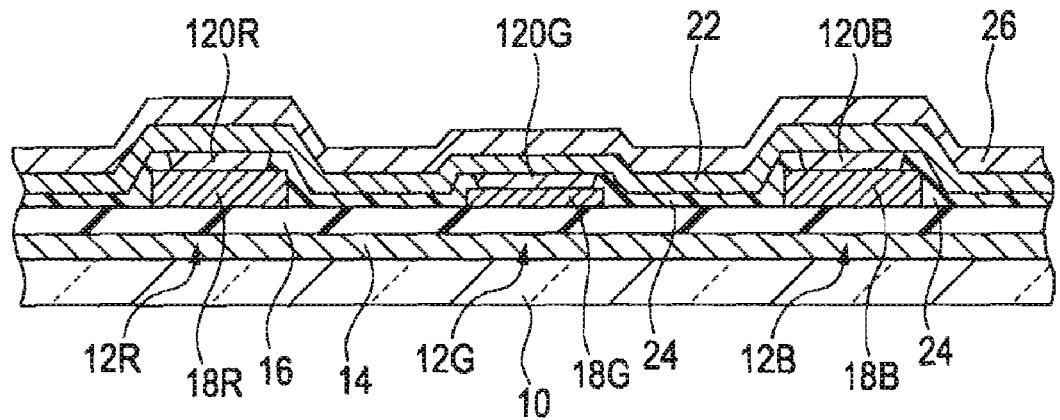
FIG. 12 is a cross-sectional view of a full-color display device of the top emission type according to a third embodiment of the invention.

FIG. 12 is a cross-sectional view of a full-color display device of the top emission type according to a third embodiment of the invention. In FIG. 12, the same reference numbers are used for components common to those in the first embodiment, and the descriptions thereof are omitted.

In the first and second embodiments, the white-light emitting luminous layer 20 common to the light-emitting elements 12 is employed. In this embodiment, the light-emitting elements 12 each include an individual luminous layer 120. The luminous layers 120 are disposed inside apertures formed in the partitions 24. Characters R, C, and B added to the reference number 120 shown in FIG. 12 indicate red, green, and blue, respectively, and correspond to color components of light emitted from light-emitting sublayers in the luminous layers 120. For example, the light-emitting sublayers in the luminous layers 120R emit red light. The luminous layers 120 are composed of organic materials, and each include, for example, a hole-injecting sublayer, a hole-transporting sublayer, a light-emitting sublayer, an electron-transporting sublayer, and an electron-injecting sublayer (not shown). The luminous layers 120 do not need to include all these sublayers, but require at least the light-emitting sublayers. In addition, the luminous layers 120 can include hole-blocking sublayers or electron-blocking sublayers for preventing holes or electrons from leaking from the light-emitting sublayers.

Part of the light emitted from the light-emitting sublayers passes through the counter electrode layer 22 and the protective layer 26. On the other hand, the other part of the light emitted from the light-emitting sublayers passes through the insulating transparent layer 16 and is reflected by the reflective layer 14. In this embodiment, the distance between the reflective layer 14 and the counter electrode layer 22 in each of the light-emitting elements is set such that light of a specific color emitted from each of the light-emitting sublayers is enhanced by interference and emitted from the counter electrode layer 22. That is, a light component having a wavelength corresponding to blue emitted from the light-emitting sublayers is enhanced at the light-emitting elements 12B such that the purity of blue is improved. A light component having a wavelength corresponding to green emitted from the light-emitting sublayers is enhanced at the light-emitting elements 12G and light components having other wavelengths are reduced such that the purity of green is improved. Moreover, a light component having a wavelength corresponding to red emitted from the light-emitting sublayers is enhanced at the light-emitting elements 12R such that the purity of red is improved.

As shown in FIG. 12, the material and the thickness of the insulating transparent layer 16 are the same at each of the light-emitting elements 12R, 12G, and 12B. The pixel electrode layers 18R, 18G, and 18B are composed of the same material, and the pixel electrode layers 18R and 18B have the same thickness. However, the thickness of the pixel electrode layers 18G differs from those of the pixel electrode layers 18R and 18B. Values of the thicknesses and the materials will be described in detail in the example described below.

Since the material and the thickness of the insulating transparent layer 16 are the same at each of the light-emitting elements 12R, 12G, and 12B, and the pixel electrode layers 18R and 18B are composed of the same material and have the same thickness, the optical path length between the reflective layer 14 and the counter electrode layer 22 at the light-emitting elements 12R is substantially the same as that at the light-emitting elements 12B (the optical path length of blue light and that of red light slightly differ from each other since the refractive indices depend on the wavelengths the light emitted from the light-emitting sublayers of the luminous layers 120R and 120B in the light-emitting elements 12R and 12B, respectively, is enhanced by interference with both the red and blue light components reflected from the reflective layer 14. However, the light-emitting elements 12R and 12B exhibit red color and blue color, respectively, since the luminous layers 120R and 120B emit red light and blue light, respectively.

In this embodiment, the pixel electrode layers 18R and 18B adjacent to the reflective layer 14 at the light-emitting elements 12P and 12B, respectively, are common components, and the insulating transparent layer 16 between the reflective layer 14 and the light-emitting elements is also the same component at the light-emitting elements 12R and 12B. Therefore, these layers in the light-emitting elements can be easily produced. Moreover, the insulating transparent layer 16 can be easily produced since the material and the thickness of the insulating transparent layer 16 are the same at the light-emitting elements 12R, 12G, and 12B.

In a modification, the pixel electrode layers 18R, 18G, and 18B in the light-emitting elements 12R, 12G, and 12B, respectively, can be composed of the same material and can have the same thickness. Moreover, the material and the thickness of the insulating transparent layer 16 can be the same at the light-emitting elements 12R and 12B. Furthermore, the thickness of the insulating transparent layer 16 at the light-emitting elements 12G can differ from those of the insulating transparent layer 16 at the light-emitting elements 12R and 12B. In this modification, the pixel electrode layers 18R and 18B adjacent to the reflective layer 14 at the light-emitting elements 12R and 12B, respectively, are common components, and the insulating transparent layer 16 between the reflective layer 14 and the light-emitting elements is also the same component at the light-emitting elements 12R and 12B. Therefore, these layers in the light-emitting elements can be easily produced. Moreover, the pixel electrode layers 18R, 18G, and 18B can be easily produced since the pixel electrode layers 18R, 18G, and 18B are composed of the same material and have the same thickness.

Example of Third Embodiment

Optical characteristics of the display device having the structure according to the third embodiment shown in FIG. 12 were investigated by simulation.

The simulation was performed under the following conditions. The insulating transparent layer 16 was composed of silicon nitride and had a uniform thickness of 50 nm. The pixel electrode layers 18G in the light-emitting layers 12G were composed of ITO and had a thickness of 50 mm. The electrode layers 18R and 18B in the light-emitting elements 12R and 12B, respectively, were composed of ITO and had a thickness of 130 nm. The counter electrode layer 22 was made transparent (example of the layer without the half mirror).

Figure 13:
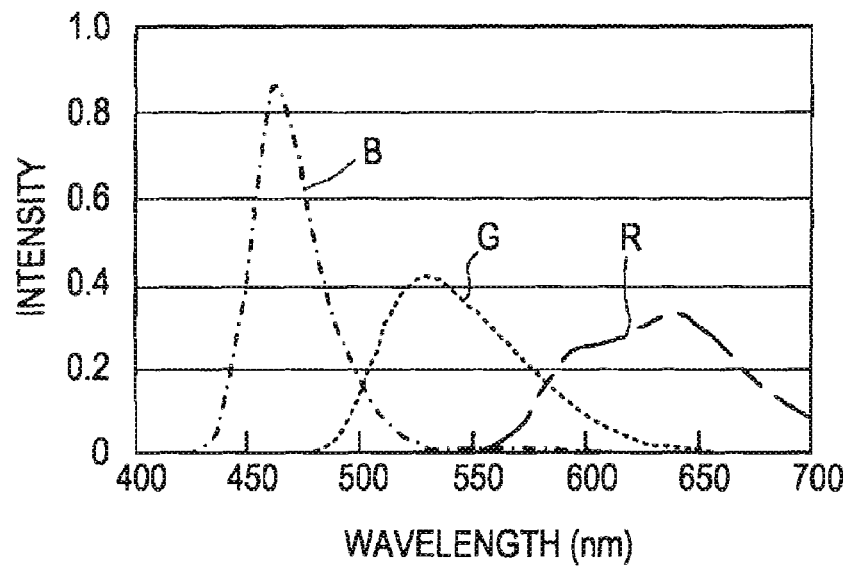
FIG. 13 illustrates results of investigation of the spectra of light in the third embodiment.

FIG. 13 illustrates simulation results of the spectra of light passing through the protective layer 26 in the third embodiment. FIG. 13 shows results of the example in which the counter electrode layer 22 was transparent, and did not include the half mirror.

In FIG. 13, a curve R indicates the spectrum of light emitted at the light-emitting elements 12R, reflected from the reflective layer 14, and passing through the protective layer 26. A curve G indicates the spectrum of light emitted at the light-emitting elements 12G, reflected from the reflective layer 14, and passing through the protective layer 26. A curve B indicates the spectrum of light emitted at the light-emitting elements 12B, reflected from the reflective layer 14, and passing through the protective layer 26.

As is clear from the curves R, G, and B in FIG. 13, excellent spectra could be obtained without using the color filters. The NTSC ratio of the light in this example was 70.53%.

In the example of the layer without the half mirror, the ratio of the brightness of red light emitted at the light-emitting elements 12R, reflected from the reflective layer 14, and passing through the protective layer 26 to that of the light emitted from light-emitting elements including light-emitting layers that emit red light in a typical bottom emission structure (extraction efficiency) was 0.452, the ratio of the brightness of green light emitted at the light-emitting elements 12G, reflected from the reflective layer 14, and passing through the protective layer 26 to that of the light emitted from light-emitting elements including light-emitting layers that emit green light in a topical bottom emission structure was 1.096, and the ratio of the brightness of blue light emitted at the light-emitting elements 12B, reflected from the reflective layer 14, and passing through the protective layer 26 to that of the light emitted from light-emitting elements including light-emitting layers that emit blue light in a typical bottom emission structure was 0.32. The efficiencies were significantly improved due to the absence of the color filters. Moreover, the average period of 20% attenuation of the light-emitting elements in this example was 3,654 hours.

On the other hand, in the example performed under the same conditions as above except that the second sublayer of the counter electrode layer 22 was composed of an alloy of magnesium and silver so as to form a translucent half-reflecting film (example of the layer with the half mirror), the ratio of the brightness of red light emitted at the light-emitting elements 12R, reflected from the reflective layer 14 and the counter electrode layer 22, and passing through the protective layer 26 to that of the light emitted from the light-emitting elements including the light-emitting layers that emit red light in a typical bottom emission structure (extraction efficiency) was 0.605, the ratio of the brightness of green light emitted at the light-emitting elements 12G, reflected from the reflective layer 14 and the counter electrode layer 22, and passing through the protective layer 26 to that of the light emitted from the light-emitting elements including the light-emitting layers that emit green light in a typical bottom emission structure was 0.924, and the ratio of the brightness of blue light emitted at the light-emitting elements 12B, reflected from the reflective layer 14 and the counter electrode layer 22, and passing through the protective layer 26 to that of the light emitted from the light-emitting elements including the light-emitting layers that emit blue light in a typical bottom emission structure was 0.199. The NTSC ratio of the light passing through the color filters in this example was 95%. Moreover, the average period of 20% attenuation of the light-emitting elements in this example was 3,386 hours.

Fourth Embodiment

Figure 14:
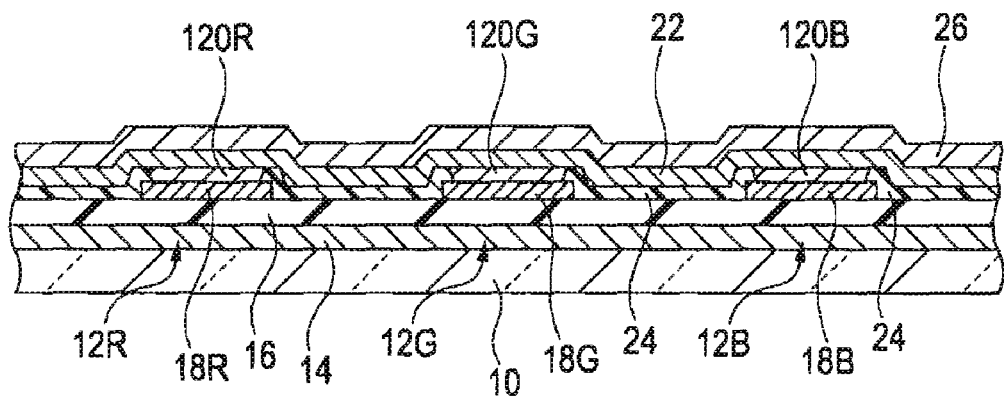
FIG. 14 is a cross-sectional view of a full-color display device of the top emission type according to a fourth embodiment of the invention.

FIG. 14 is a cross-sectional view of a full-color display device of the top emission type according to a fourth embodiment of the invention. In FIG. 14, the same reference numbers are used for components common to those in the third embodiment, and the descriptions thereof are omitted.

As shown in FIG. 14, the material and the thickness of the insulating transparent layer 16 are the same at each of the light-emitting elements 12R, 12G, and 12B. The pixel electrode layers 18R, 18G, and 18B are composed of the same material, and have the same thickness. Values of the thicknesses and the materials will be described in detail in the examples described below.

Since the material and the thickness of the insulating transparent layer 16 are the same at each of the light-emitting elements 12R, 12G, and 12B, and the pixel electrode layers 18R, 18G, and 18B are composed of the same material and have the same thickness, the optical path length between the reflective layer 14 and the counter electrode layer 22 at each of the light-emitting elements 12R, 12G, and 12B is substantially the same (the optical path lengths of blue light, green light, and red light slightly differ from each other since the refractive indices depend on the wavelengths). The light emitted from the light-emitting sublayers of the luminous layers 120 in the light-emitting elements 12R, 12G, and 12B is enhanced by interference with the red, green, and blue light components reflected from the reflective layer 14. However, the light-emitting elements 12R, 12G, and 12B exhibit red color, green color, and blue color, respectively, since the luminous layers 120R, 120G, and 120B emit red light, green light, and blue light, respectively.

In this embodiment, the pixel electrode layers 18R, 18G, and 18B adjacent to the reflective layer 14 at the light-emitting elements 12R, 12G, and 12B, respectively, are common components, and the insulating transparent layer 16 between the reflective layer 14 and the light-emitting elements is also the same component at the light-emitting elements 12R, 12G, and 12B. Therefore, these layers in the light-emitting elements can be easily produced.

Example of Fourth Embodiment

Optical characteristics of the display device having the structure according to the fourth embodiment shown in FIG. 14 were investigated by simulation.

The simulation was performed under the following conditions. The insulating transparent layer 16 was composed of silicon nitride and had a uniform thickness of 580 nm. The pixel electrode layers 18R, 18G, and 18B were composed of ITO and had a thickness of 100 nm. The counter electrode layer 22 was made transparent (example of the layer without the half mirror).

Figure 15:
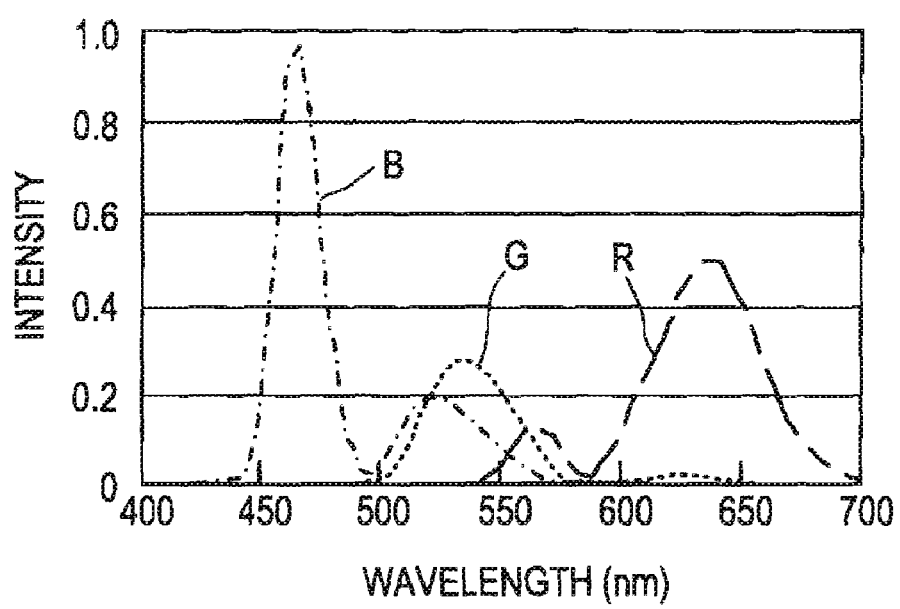
FIG. 15 illustrates results of investigation of the spectra of light in the fourth embodiment.

FIG. 15 illustrates simulation results of the spectra of light passing through the protective layer 26 in the fourth embodiment. FIG. 15 shows results of the example in which the counter electrode layer 22 was transparent, and did not include the half mirror.

In FIG. 15, curves R, G, and B indicate the same spectra as in FIG. 13. As is clear from the curves R, G, and B in FIG. 15, the display device according to this example can be used as an image display device including blue, green, and red pixels without using the color filters. The NTSC ratio in this example was 68.9%.

In the example of the layer without the half mirror, the ratio of the brightness of red light emitted at the light-emitting elements 12R, reflected from the reflective layer 14, and passing through the protective layer 26 to that of the light emitted from the light-emitting elements including the light-emitting layers that emit red light in a typical bottom emission structure (extraction efficiency) was 0.353, the ratio of the brightness of green light emitted at the light-emitting elements 12G, reflected from the reflective layer 14, and passing through the protective layer 26 to that of the light emitted from the light-emitting elements including the light-emitting layers that emit green light in a typical bottom emission structure was 0.727, and the ratio of the brightness of blue light emitted at the light-emitting elements 12B, reflected from the reflective layer 14, and passing through the protective layer 26 to that of the light emitted from the light-emitting elements including the light-emitting layers that emit blue light in a typical bottom emission structure was 0.61. The efficiencies were significantly improved due to the absence of the color filters. Moreover, the average period of 20% attenuation of the light-emitting elements in this example was 2,100 hours.

On the other hand, in the example performed under the same conditions as above except that the second sublayer of the counter electrode layer 22 was composed of an alloy of magnesium and silver so as to form a translucent half-reflecting film (example of the layer with the half mirror), the ratio of the brightness of red light emitted at the light-emitting elements 12R, reflected from the reflective layer 14 and the counter electrode layer 22, and passing through the protective layer 26 to that of the light emitted from the light-emitting elements including the light-emitting layers that emit red light in a typical bottom emission structure (extraction efficiency) was 0.267, the ratio of the brightness of green light emitted at the light-emitting elements 12G, reflected from the reflective layer 14 and the counter electrode layer 22, and passing through the protective layer 26 to that of the light emitted from the light-emitting elements including the light-emitting layers that emit green light in a typical bottom emission structure was 0.785, and the ratio of the brightness of blue light emitted at the light-emitting elements 12B, reflected from the reflective layer 14 and the counter electrode layer 22, and passing through the protective layer 26 to that of the light emitted from the light-emitting elements including the light-emitting layers that emit blue light in a typical bottom emission structure was 0.634. The NTSC ratio of the light passing through the color filters in this example was 77.2%. Moreover, the average period of 20% attenuation of the light-emitting elements in this example was 2,010 hours.

SUMMARY

FIG. 16 shows the summary of the measurement results in the above-described examples.

Other Embodiments

Organic EL devices have been described as examples in the above-described embodiments. However, inorganic EL devices are also encompassed within the scope of the invention.

Electronic Apparatus

Figure 17A:
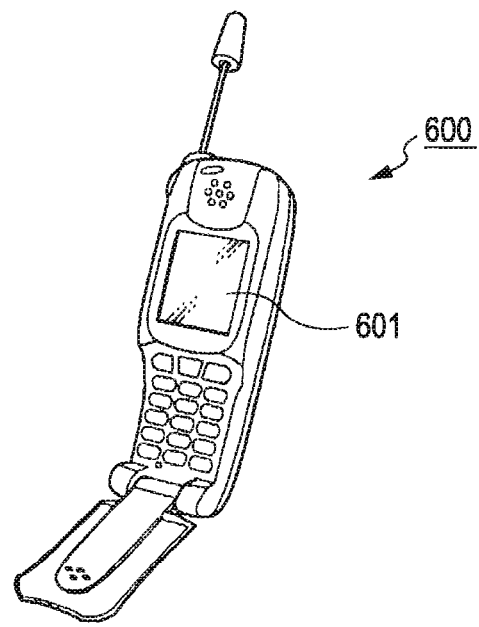
FIGS. 17A to 17C are perspective views illustrating various electronic apparatuses including the display device according to the embodiments of the invention as image display devices.
Figure 17B:
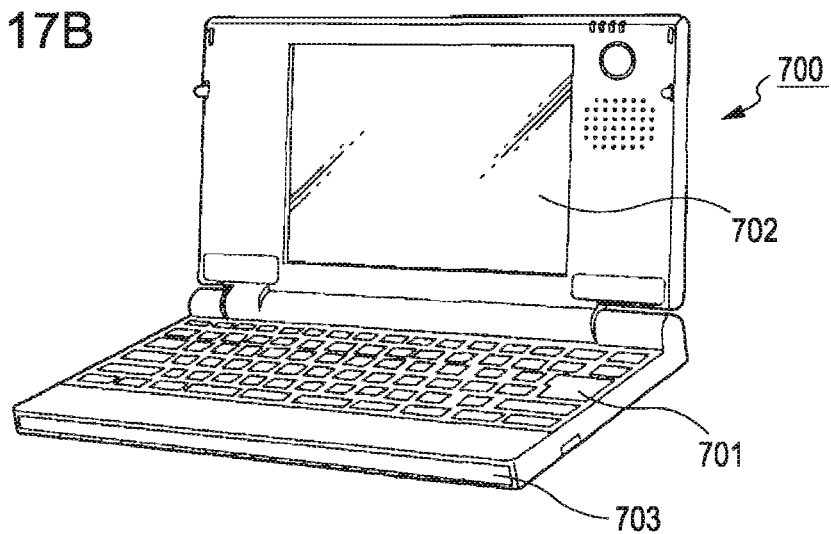
Figure 17C:
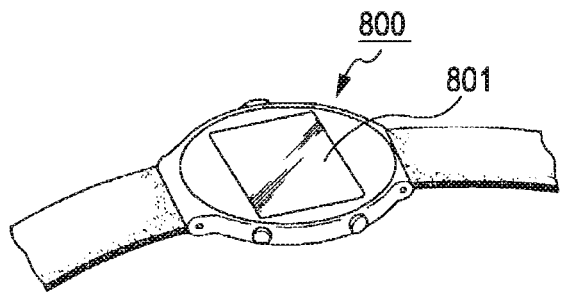

Next, various electronic apparatuses including the display device according to the embodiments of the invention as image display devices will be described with reference to FIGS. 17A to 17C. FIG. 17A is a perspective view of a cellular phone. In FIG. 17A, the cellular phone includes a body 600 and a display section 601 into which the display device according to any one of the above-described embodiments is incorporated. FIG. 17B is a perspective view of a mobile information processor such as a word processor and a personal computer. In FIG. 17B, an information processor 700 includes an input section 701 such as a keyboard, a body 703, and a display section 702 into which the display device according to any one of the above-described embodiments is incorporated. FIG. 17C is a perspective view of an electronic apparatus of the wristwatch type. In FIG. 17C, the electronic apparatus includes a body 800 and a display section 801 into which the display device according to any one of the above-described embodiments is incorporated.

The electronic apparatuses shown in FIGS. 17A to 17C each include the display device according to any one of the above-described embodiments as the display section, thereby achieving high-chromatic-purity display.

Electronic apparatuses to which the display device according to the above-described embodiments of the invention is applicable can be those including image display devices such as personal digital assistants (PDAs), digital still cameras, televisions, video cameras, car navigation systems, pagers, electronic notepads, electronic paper, calculators, word processors, workstations videophones, point-of-sale (POS) terminals, video players, and devices including touch panels in addition to those shown in FIGS. 17A to 17C.

What is claimed is:

1. A display device comprising:
   a substrate;
   a plurality of light-emitting elements formed on the substrate; and
   a reflective layer disposed between the substrate and the light-emitting elements and reflecting lights emitted from the light-emitting elements, wherein the light-emitting elements each include a transparent layer that is in contact with the reflective layer, a light-emitting layer disposed on the upper surface of the transparent layer, and an electrode layer with transparency disposed on a side of the light-emitting layer opposite the side on which the reflective layer lies,
   the distance between the reflective layer and the electrode layer in each of the light-emitting elements is set such that a light component of a specific color in the light emitted from the corresponding light-emitting layer is enhanced by interference and emitted from the electrode layer, and
   the light-emitting elements include at least first light-emitting elements and second light-emitting elements in which blue and red light components in the light emitted from the light-emitting layers are simultaneously enhanced and emitted from the electrode layer, the light-emitting elements further include third light-emitting elements in which a green light component in the light emitted from the light-emitting layers is enhanced and emitted from the electrode layers, and
   the distance between the reflective layer and the electrode layer in each of the third light-emitting elements is set such that the green light component is enhanced, wherein color filters that allow passage of only blue light are disposed at a light-emitting side of the electrode layers in the first light-emitting elements, color filters that allow passage of only red light are disposed at a light-emitting side of the electrode layers in the second light-emitting elements, and blue and red transparent pixel electrode layers having substantially the same thickness and both having a greater thickness than a green transparent pixel electrode layer.

2. The display device according to claim 1, wherein the thickness of the transparent layers in the third light-emitting elements is the same as the thicknesses of the transparent layers in the first and second light-emitting elements.

3. The display device according to claim 1, wherein color filters that allow passage of only green light are disposed at a light-emitting side of the electrode layers in the third light-emitting elements.

4. The display device according to claim 1, wherein
the transparent layers each include a transparent electrode and an insulating transparent sublayer, and
the resonant optical path lengths are adjusted by changing the thicknesses of the transparent electrodes.

5. The display device according to claim 4, wherein the insulating transparent sublayers in the transparent layers in the first, second, and third light-emitting elements are common to the first, second, and third light-emitting elements.

6. The display device according to claim 1, wherein
the transparent layers each include a transparent electrode and an insulating transparent sublayer, and
the resonant optical path lengths are adjusted by changing the thicknesses of the insulating transparent sublayers.

7. The display device according to claim 6, wherein the thicknesses of the transparent electrodes in the first and second light-emitting elements are the same.

8. The display device according to claim 1, wherein an organic layer disposed between the reflective layer and the electrode layers is shared by the first, second, and third light-emitting elements.

9. The display device according to claim 1, wherein an organic layer disposed between the reflective layer and the electrode layers includes a blue-light emitting material in the first light-emitting elements, a red-light emitting material in the second light-emitting elements, and a green-light emitting material in the third light-emitting elements.

10. An electronic apparatus comprising:
the display device according to claim 1.

11. The display device according to claim 1, wherein the optical distance between the reflective layer and the electrode layer for the first and second light emitting elements is substantially the same and the optical distance for the third light emitting element is less than the optical distance of the first and second light emitting elements.

12. A display device comprising:
a substrate;
a plurality of light-emitting elements formed on the substrate; and
a reflective layer disposed between the substrate and the light-emitting elements and reflecting lights emitted from the light-emitting elements, wherein
the light-emitting elements each include a transparent layer that is in contact with the reflective layer, a light-emitting layer disposed on the upper surface of the transparent layer, and an electrode layer with transparency disposed on a side of the light-emitting layer opposite the side on which the reflective layer lies,
the distance between the reflective layer and the electrode layer in each of the light-emitting elements is set such that a light component of a specific color in the light emitted from the corresponding light-emitting layer is enhanced by interference and emitted from the electrode layer, and
the light-emitting elements include at least first light-emitting elements and second light-emitting elements in which blue and red light components in the light emitted from the light-emitting layers are enhanced and emitted from the electrode layer,
the light-emitting elements further include third light-emitting elements in which a green light component in the light emitted from the light-emitting layers is enhanced and emitted from the electrode layers, and
the distance between the reflective layer and the electrode layer in each of the third light-emitting elements is set such that the green light component is enhanced, wherein
blue and red transparent pixel electrode layers having substantially the same thickness and both having a greater thickness than a green transparent pixel electrode layer.

* * * * *